(12) United States Patent
Nishihara et al.

(10) Patent No.: US 12,428,752 B2
(45) Date of Patent: Sep. 30, 2025

(54) SILICON CARBIDE EPITAXIAL SUBSTRATE

(71) Applicant: SUMITOMO ELECTRIC INDUSTRIES, LTD., Osaka (JP)

(72) Inventors: Hiroki Nishihara, Osaka (JP); Takaya Miyase, Osaka (JP); Taro Nishiguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 416 days.

(21) Appl. No.: 18/025,029

(22) PCT Filed: Sep. 2, 2021

(86) PCT No.: PCT/JP2021/032320
§ 371 (c)(1),
(2) Date: Mar. 7, 2023

(87) PCT Pub. No.: WO2022/054692
PCT Pub. Date: Mar. 17, 2022

(65) Prior Publication Data
US 2024/0026569 A1    Jan. 25, 2024

(30) Foreign Application Priority Data
Sep. 10, 2020    (JP) ................ 2020-152170

(51) Int. Cl.
*C30B 29/36*    (2006.01)
*C30B 25/20*    (2006.01)

(52) U.S. Cl.
CPC .............. *C30B 29/36* (2013.01); *C30B 25/20* (2013.01)

(58) Field of Classification Search
CPC .......... C30B 25/16; C30B 25/20; C30B 29/36
See application file for complete search history.

(56) References Cited

U.S. PATENT DOCUMENTS

2019/0242014 A1* 8/2019 Kanbara ................ C23C 16/42

FOREIGN PATENT DOCUMENTS

| JP | 2014-1108 A | 1/2014 |
|---|---|---|
| JP | 2019-208077 A | 12/2019 |
| JP | 2020-114796 A | 7/2020 |
| WO | 2019/049525 A1 | 3/2019 |

\* cited by examiner

*Primary Examiner* — Jaehwan Oh
(74) *Attorney, Agent, or Firm* — Renner, Otto, Boisselle & Sklar, LLP

(57) ABSTRACT

A silicon carbide epitaxial substrate includes a silicon carbide substrate, a silicon carbide epitaxial film. The silicon carbide epitaxial film is on the silicon carbide substrate. The first extended defect is in the silicon carbide epitaxial film. The first extended defect includes a particle, a triangular defect extending from the particle along an off-direction, and a basal plane dislocation originating from the particle and having a portion extending along a direction perpendicular to each of a thickness direction of the silicon carbide substrate and the off-direction. In the direction perpendicular to each of the thickness direction of the silicon carbide substrate and the off-direction, an extended width of the basal plane dislocation is twice or more a base width of the triangular defect. In a second main surface, an area density of the basal plane dislocation included in the first extended defect is 3/cm² or less.

6 Claims, 11 Drawing Sheets

SILICON CARBIDE EPITAXIAL SUBSTRATE

TECHNICAL FIELD

The present disclosure relates to a silicon carbide epitaxial substrate. This application claims priority based on Japanese Patent Application No. 2020-152170 filed on Sep. 10, 2020, and the entire contents of the Japanese patent application are incorporated herein by reference.

BACKGROUND ART

WO 2019/049525 (PTL 1) discloses a silicon carbide epitaxial substrate having a main surface. In the silicon carbide epitaxial substrate, a value Obtained by dividing an area density of an annular defect viewed from a direction perpendicular to the main surface by an area density of the plurality of threading dislocations in the main surface is 0.00002 to 0.004.

PRIOR ART DOCUMENT

Patent Literature

PTL 1: WO 2019/049525

SUMMARY OF INVENTION

A silicon carbide epitaxial substrate according to the present disclosure includes a silicon carbide substrate, a silicon carbide epitaxial film, and a first extended defect. The silicon carbide epitaxial film is on the silicon carbide substrate. The first extended defect is in the silicon carbide epitaxial film. The silicon carbide epitaxial film has a first main surface in contact with the silicon carbide substrate and a second main surface opposite to the first main surface. The second main surface is inclined in an off-direction with respect to a {0001} plane. The first extended defect includes a particle, a triangular defect extending from the particle along the off-direction, and a basal plane dislocation originating from the particle and having a portion extending along a direction perpendicular to each of a thickness direction of the silicon carbide substrate and the off-direction. In the direction perpendicular to each of the thickness direction of the silicon carbide substrate and the off-direction, an extended width of the basal plane dislocations is twice or more a base width of the triangular defect. In the second main surface, an area density of the basal plane dislocations included in the first extended defect is 3/cm² or less.

A silicon carbide epitaxial substrate according to the present disclosure includes a silicon carbide substrate, a silicon carbide epitaxial film, and a first extended defect. The silicon carbide epitaxial film is on the silicon carbide substrate. The first extended defect is in the silicon carbide epitaxial film. The silicon carbide epitaxial film has a first main surface in contact with the silicon carbide substrate and a second main surface opposite to the first main surface. The second main surface is inclined in an off-direction with respect to a {0001} plane. The first extended defect includes a particle, a triangular defect extending from the particle along the off-direction, and a basal plane dislocation originating from the particle and having a portion extending along a direction perpendicular to each of a thickness direction of the silicon carbide substrate and the off-direction. In the direction perpendicular to each of the thickness direction of the silicon carbide substrate and the off-direction, an extended width of the basal plane dislocation is twice or more a base width of the triangular defect. In the second main surface, an area density of the basal plane dislocation included in the first extended defect is 3/cm² or less. The silicon carbide epitaxial film may have a thickness of 30 μm or more. The second main surface may be inclined in the off-direction at an angle of 5° or less with respect to the {0001} plane. The silicon carbide substrate may have a diameter of 100 mm or more. A polytype of the silicon carbide substrate may be 4H.

DESCRIPTION OF EMBODIMENTS

Figure 1:
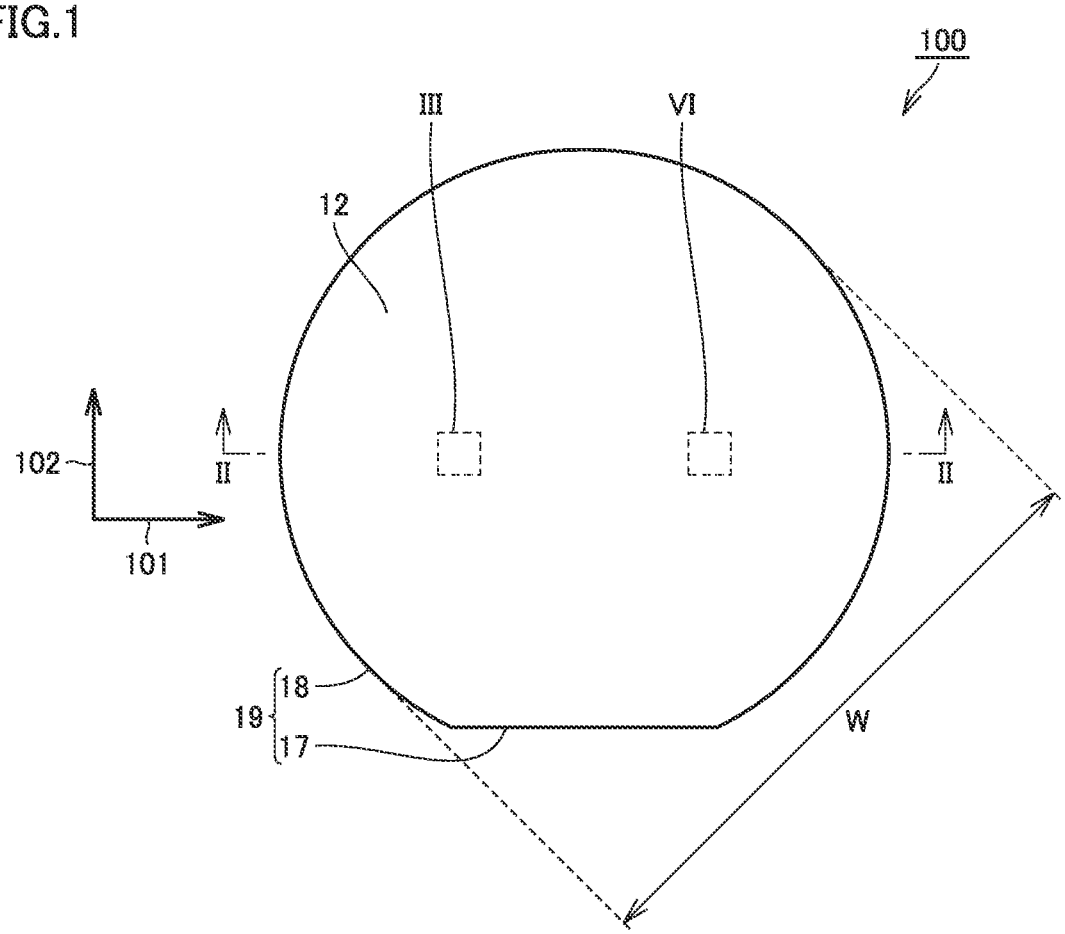
FIG. 1 is a schematic plan view showing a structure of a silicon carbide epitaxial substrate according to an embodiment of the present disclosure.

Problem to be Solved by the Present Disclosure

An object of the present disclosure is to provide a silicon carbide epitaxial substrate capable of improving reliability of a silicon carbide semiconductor device.

Advantageous Effects of the Present Disclosure

According to the present disclosure, it is possible to provide a silicon carbide epitaxial substrate capable of improving reliability of a silicon carbide semiconductor device.

Summary of Embodiments of the Present Disclosure

First, a summary of embodiments of the present disclosure will be provided. Regarding crystallographic indications in the present specification, an individual orientation is represented by [ ], a group orientation is represented by < >, an individual plane is represented by ( ), and a group plane is represented by { }. The negative crystallographic index is usually expressed by adding "–" (bar) above a numeral, but in the present specification, the negative crystallographic index is expressed by adding a negative sign before the numeral.

(1) A silicon carbide epitaxial substrate 100 according to the present disclosure includes a silicon carbide substrate 10, a silicon carbide epitaxial film 20, and a first extended defect 5. Silicon carbide epitaxial film 20 is on silicon carbide substrate 10. First extended defect 5 is in silicon carbide epitaxial film 20. Silicon carbide epitaxial film 20 has a first main surface 11 in contact with silicon carbide substrate 10 and a second main surface 12 opposite to first main surface 11. Second main surface 12 is inclined in an off-direction 104 with respect to a {0001} plane. First extended defect 5 includes a particle 1, a triangular defect 2 extending from particle 1 along off-direction 104, and a basal plane dislocation 3 originating from particle 1 and having a portion extending along a direction perpendicular to each of a thickness direction of silicon carbide substrate 10 and off-direction 104. In the direction (a second direction 102) perpendicular to each of the thickness direction 103 of silicon carbide substrate 10 and off-direction 104, an extended width B of basal plane dislocation 3 is twice or more a base width L of triangular defect 2. In the second main surface, an area density of basal plane dislocation 3 included in first extended defect 5 is 3/cm² or less.

(2) In silicon carbide epitaxial substrate 100 according to (1), silicon carbide epitaxial film 20 may have a thickness of 30 μm or more.

(3) In silicon carbide epitaxial substrate 100 according to (1) or (2), second main surface 12 may be inclined in off-direction 104 at an angle of 5° or less with respect to the {0001} plane.

(4) In silicon carbide epitaxial substrate 100 according to any one of (1) to (3), silicon carbide substrate 10 may have a diameter of 100 mm or more.

(5) In silicon carbide epitaxial substrate 100 according to any one of (1) to (4), a polytype of silicon carbide substrate 10 may be 4H.

(6) Silicon carbide epitaxial substrate 100 according to the present disclosure includes silicon carbide substrate 10, silicon carbide epitaxial film 20, and first extended defect 5. Silicon carbide epitaxial film 20 is on silicon carbide substrate 10. First extended defect 5 is in silicon carbide epitaxial film 20. Silicon carbide epitaxial film 20 has first main surface 11 in contact with silicon carbide substrate 10 and second main surface 12 opposite to first main surface 11. Second main surface 12 is inclined in off-direction 104 with respect to a {0001} plane. First extended defect 5 includes particle 1, triangular defect 2 extending from particle 1 along off-direction 104, and basal plane dislocation 3 originating from the particle and having a portion extending along a direction perpendicular to each of a thickness direction of silicon carbide substrate 10 and off-direction 104. In the direction (second direction 102) perpendicular to each of thickness direction 103 of silicon carbide substrate 10 and off-direction 104, extended width B of basal plane dislocation 3 is twice or more base width L of triangular defect 2. In the second main surface, an area density of basal plane dislocation 3 included in first extended defect 5 is 3/cm² or less. Silicon carbide epitaxial film 20 may have a thickness of 30 μm or more. Second main surface 12 may be inclined in off-direction 104 at an angle of 5° or less with respect to the {0001} plane. Silicon carbide substrate 10 may have a diameter of 100 mm or more. A polytype of silicon carbide substrate 10 may be 4H.

Details of Embodiments of the Present Disclosure

The details of embodiments of the present disclosure are set forth below. In the following description, identical or corresponding elements are provided with the same reference signs and will not be described repeatedly.

Figure 2:
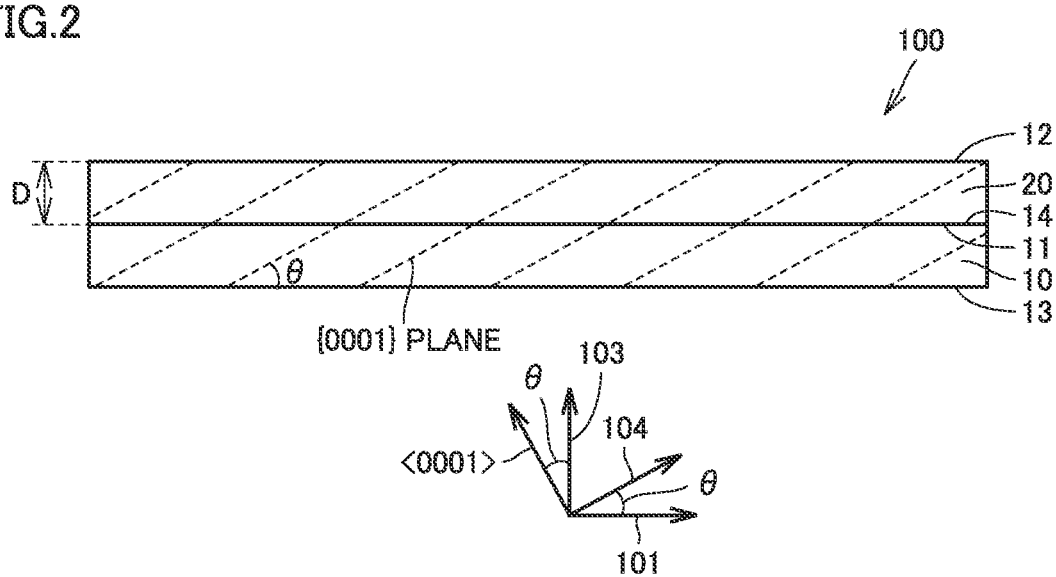
FIG. 2 is a schematic cross-sectional view taken along a line II-II of FIG. 1.

First, a structure of a silicon carbide epitaxial substrate 100 according to an embodiment of the present disclosure will be described. FIG. 1 is a schematic plan view showing the structure of silicon carbide epitaxial substrate 100 according to the embodiment of the present disclosure. FIG. 2 is a schematic cross-sectional view taken along a line II-II of FIG. 1.

As shown in FIGS. 1 and 2, silicon carbide epitaxial substrate 100 according to the embodiment of the present disclosure includes a silicon carbide substrate 10 and a silicon carbide epitaxial film 20. Silicon carbide epitaxial film 20 is on silicon carbide substrate 10. Silicon carbide epitaxial film 20 has a first main surface 11 and a second main surface 12. First main surface 11 is in contact with silicon carbide substrate 10. Second main surface 12 is opposite to first main surface 11. Silicon carbide substrate 10 has a third main surface 13 and a fourth main surface 14. Fourth main surface 14 is opposite to third main surface 13. Fourth main surface 14 is in contact with silicon carbide epitaxial film 20.

As shown in FIG. 1, when viewed in a thickness direction 103 of silicon carbide epitaxial substrate 100, silicon carbide epitaxial substrate 100 has an outer peripheral edge 19. Outer peripheral edge 19 includes, for example, an orientation flat 17 and an arc-shaped portion 18. Orientation flat 17 extends along a first direction 101. As shown in FIG. 1, orientation flat 17 is linear when viewed in thickness direction 103 of silicon carbide epitaxial substrate 100. Arc-shaped portion 18 is connected to orientation flat 17. When viewed in thickness direction 103 of silicon carbide epitaxial substrate 100, arc-shaped portion 18 has an arc shape.

As shown in FIG. 1, when viewed in thickness direction 103 of silicon carbide epitaxial substrate 100, second main surface 12 extends along each of first direction 101 and second direction 102. When viewed in thickness direction 103 of silicon carbide epitaxial substrate 100, first direction 101 is perpendicular to second direction 102.

First direction 101 is, for example, the <11-20> direction. First direction 101 may be, for example, the [11-20] direction. First direction 101 may be a direction obtained by projecting the <11-20> direction onto first main surface 11. From another viewpoint, first direction 101 may be a direction including the <11-20> direction component, for example.

Second direction 102 is, for example, the <1-100> direction. Second direction 102 may be, for example, the [1-100] direction. Second direction 102 may be, for example, a direction obtained by projecting the <1-100> direction onto first main surface 11. From another viewpoint, second direction 102 may be a direction including the <1-100> direction component, for example.

As shown in FIG. 1, a diameter W of silicon carbide substrate 10 is not particularly limited, but is, for example, 100 mm (4 inches) or more. Diameter W may be 125 mm (5 inches) or more or may be 150 mm (6 inches) or more. The upper limit of diameter W is not particularly limited. Diameter W may be, for example, 200 (8 inches) mm or less.

As used herein, 2 inches refers to 50 mm or 50.8 mm (2 inches×25.4 mm/inch). 4 inches refers to 100 mm or 101.6 mm (4 inches×25.4 mm/inch). 5 inches refers to 125 mm or 127.0 mm (5 inches×25.4 mm/inch). 6 inches refers to 150 mm or 152.4 mm (6 inches×25.4 mm/inch). 8 inches refers to 200 mm or 203.2 mm (8 inches×25.4 mm/inch).

As shown in FIG. 2, second main surface 12 constitutes a surface of silicon carbide epitaxial substrate 100. Third main surface 13 constitutes a backside surface of silicon carbide epitaxial substrate 100. The polytype of silicon carbide constituting silicon carbide substrate 10 is, for example, 4H. The polytype of silicon carbide constituting silicon carbide epitaxial film 20 is, for example, 4H.

A plane indicated by a dashed line in FIG. 2 is the {0001} plane. Second main surface 12 is inclined in off-direction 104 with respect to the {0001} plane. Specifically, second main surface 12 may be inclined in off-direction 104 at an angle (an off-angle θ) of 5° or less with respect to the {0001} plane. In other words, off-angle θ with respect to the {0001} plane is, for example, 5° or less. Off-angle θ may be, for example, 4° or less. The lower limit of off-angle θ is not particularly limited and may be, for example, 1° or more or 2° or more.

The off-direction (inclination direction) is fourth direction 104. Off-direction 104 is, for example, the <11-20> direction. Third direction 103 is a thickness direction of silicon carbide substrate 10. Thickness direction 103 of silicon carbide substrate 10 is a direction perpendicular to second main surface 12. Third direction 103 is inclined with respect to the <0001> direction. The inclination angle of third direction 103 with respect to the <0001> direction is the same as off-angle θ.

Silicon carbide substrate 10 contains an n-type impurity such as nitrogen (N). The conductivity type of silicon carbide substrate 10 is, for example, an n-type (first conductivity type). Silicon carbide substrate 10 has a thickness of 350 μm to 500 μm, for example. Silicon carbide epitaxial film 20 contains an n-type impurity such as nitrogen. A thickness D of silicon carbide epitaxial film 20 is, for example, 30 μm or more. Thickness D of silicon carbide epitaxial film 20 may be, for example, 40 μm or more or 50 μm or more. The upper limit of thickness D of silicon carbide epitaxial film 20 is not particularly limited and may be, for example, 100 μm or less. The conductivity type of silicon carbide epitaxial film 20 is, for example, n-type. The concentration of the n-type impurity included in silicon carbide epitaxial film 20 may be lower than the concentration of the n-type impurity included in silicon carbide substrate 10.

Figure 3:
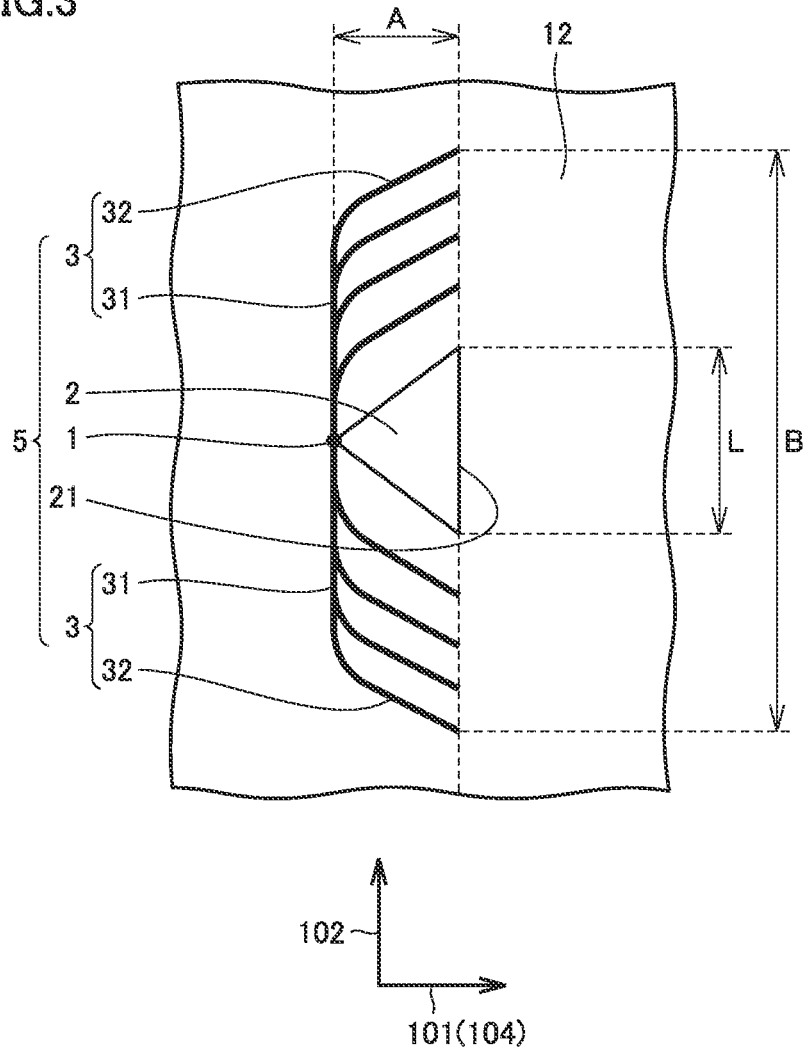
FIG. 3 is an enlarged schematic plan view of a region III of FIG. 1.
Figure 4:
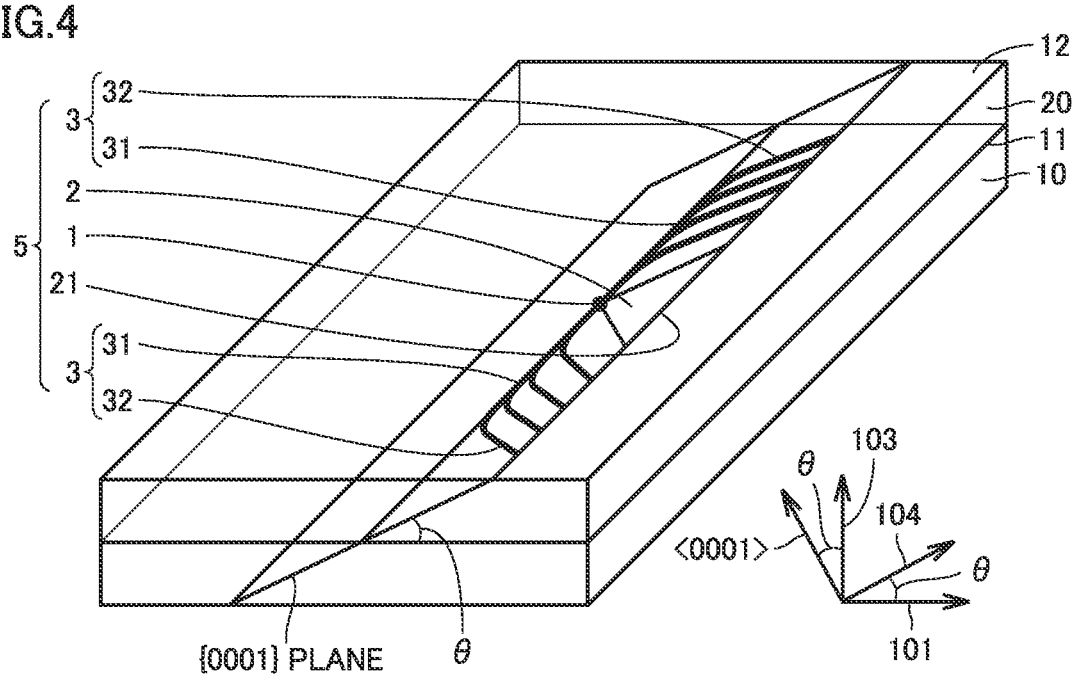
FIG. 4 is a schematic perspective view showing a structure of a first extended defect.

FIG. 3 is an enlarged schematic plan view of a region III of FIG. 1. FIG. 4 is a schematic perspective view showing a structure of a first extended defect 5. As shown in FIGS. 3 and 4, silicon carbide epitaxial substrate 100 has first extended defect 5. As shown in FIG. 4, first extended defect 5 is on silicon carbide substrate 10. First extended defect 5 is in silicon carbide epitaxial film 20. First extended detect 5 is surrounded by silicon carbide epitaxial film 20 when viewed in thickness direction 103 of silicon carbide substrate 10.

First extended defect 5 includes a particle 1, a triangular defect 2, and a basal plane dislocation 3. Particle 1 is connected to each of basal plane dislocation 3 and triangular defect 2. In other words, each of basal plane dislocation 3 and triangular detect 2 grows from particle 1 as an originating point. As shown in FIG. 3, when viewed in thickness direction 103 of silicon carbide epitaxial film 20, triangular defect 2 has a triangular shape. One of the three vertices of the triangle is connected to particle 1.

Particle 1 is, for example, a silicon carbide particle or a carbon particle. For example, particle 1 has a diameter of 1 μm to 1 mm, but is not limited thereto. Particle 1 may be, for example, a downfall resulting from falling of a deposition substance in a growth apparatus onto the surface of silicon carbide substrate 10. When particle 1 is composed of silicon carbide, the polytype of silicon carbide of particle 1 may be different from the polytype of silicon carbide constituting silicon carbide epitaxial film 20.

As shown in FIG. 4, particle 1 is located at a boundary between, for example, silicon carbide substrate 10 and silicon carbide epitaxial film 20. In other words, particle 1 is located between silicon carbide substrate 10 and silicon carbide epitaxial film 20, for example. As shown in FIGS. 3 and 4, triangular defect 2 extends from particle 1 along the off-direction (fourth direction 104). One end of triangular defect 2 in off-direction 104 is connected to particle 1 at the boundary between silicon carbide substrate 10 and silicon carbide epitaxial film 20. The other end of triangular defect 2 in off-direction 104 is exposed on second main surface 12. The portion of triangular defect 2 exposed on second main surface 12 is a base 21 of triangular defect 2.

As shown in FIGS. 3 and 4, basal plane dislocation 3 has a first portion 31 and a second portion 32. First portion 31 extends on both sides of particle 1. As shown in FIG. 3, first portion 31 originates from particle 1 and extends along a direction (second direction 102) perpendicular to each of thickness direction 103 and off-direction 104 of silicon carbide substrate 10. In other words, when viewed in thickness direction 103 of silicon carbide substrate 10, first portion 31 extends along a direction perpendicular to off-direction 104.

Second portion 32 is connected to first portion 31. When viewed in thickness direction 103 of silicon carbide substrate 10, the extending direction of second portion 32 is inclined with respect to each of the extending direction of first portion 31 and off-direction 104. Second portion 32 continuously extends from first main surface 11 to second main surface 12. One end of second portion 32 is exposed on second main surface 12. The other end of second portion 32 is connected to first portion 31 on first main surface 11.

Figure 5:
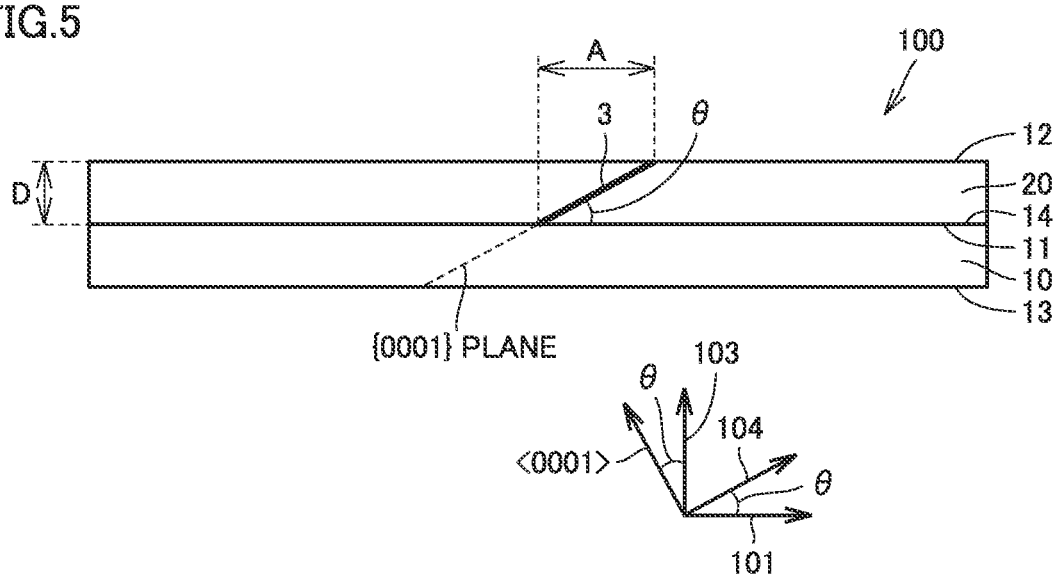
FIG. 5 is a schematic cross-sectional view showing a structure of a basal plane dislocation.

FIG. 5 is a schematic cross-sectional view showing a structure of basal plane dislocation 3. As shown in FIG. 5, basal plane dislocation 3 is located on the basal plane. The basal plane is inclined with respect to each of first main surface 11 and second main surface 12. Basal plane dislocation 3 extends from first main surface 11 toward second main surface 12 on the basal plane. As shown in FIG. 3, when viewed in thickness direction 103 of silicon carbide substrate 10, if the length of basal plane dislocation 3 along off-direction 104 is A, the off-angle of silicon carbide substrate 10 is θ, and the thickness of silicon carbide epitaxial film 20 is D, then D=A×tan θ.

As shown in FIG. 3, when viewed in thickness direction 103 of silicon carbide epitaxial film 20, triangular defect 2 has a triangular shape. One of the three vertices of the triangle is connected to particle 1. The opposite side of the vertex of the triangle connected to particle 1 is base 21 of triangular defect 2. In other words, when viewed from the center of gravity of triangular defect 2, the side opposite to the vertex of the triangle connected to particle 1 is base 21 of triangular defect 2.

Extended width B of basal plane dislocation 3 is a maximum value of a width of basal plane dislocation 3 in the direction (second direction 102) perpendicular to each of thickness direction 103 and off-direction 104 of silicon carbide substrate 10. In first extended defect 5, extended width B of basal plane dislocation 3 extending along the direction (second direction 102) perpendicular to each of thickness direction 103 and off-direction 104 of silicon carbide substrate 10 is twice or more a base width L of triangular defect 2. When viewed in thickness direction 103 of silicon carbide substrate 10, a length A of first extended defect 5 in first direction 101 may be less than the length (extended width B) of first extended defect 5 in second direction 102.

The area density of basal plane dislocation 3 included in first extended defect 5 is $3/cm^2$ or less. The area density of basal plane dislocation 3 included in first extended defect 5 may be, for example, $2.5/cm^2$ or less, $2/cm^2$ or less, or $1.5/cm^2$ or less. The lower limit of the area density of basal plane dislocation 3 included in first extended defect 5 is not particularly limited, and may be, for example, $0.1/cm^2$ or more, or $0.2/cm^2$ or more. The area density of basal plane dislocation 3 included in first extended defect 5 is a value obtained by dividing the total number of basal plane dislocation(s) 3 included in first extended defect 5 on second main surface 12 by the area of second main surface 12.

Figure 6:
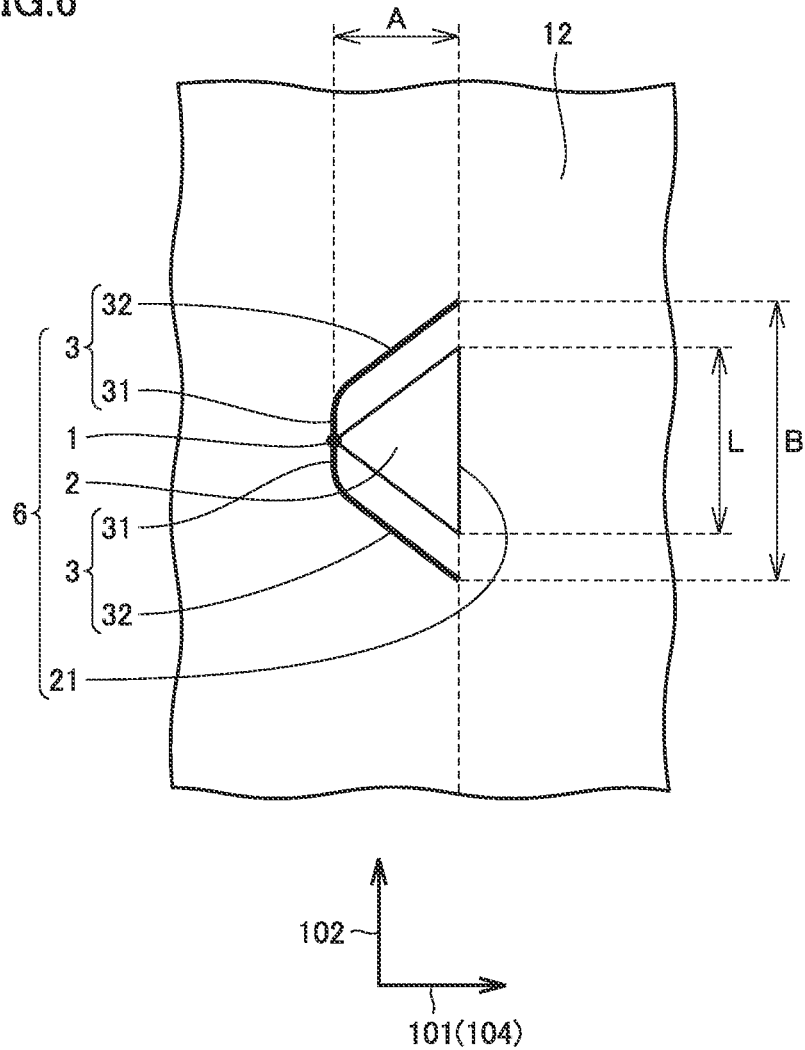
FIG. 6 is an enlarged schematic plan view of a region VI of FIG. 1.
Figure 7:
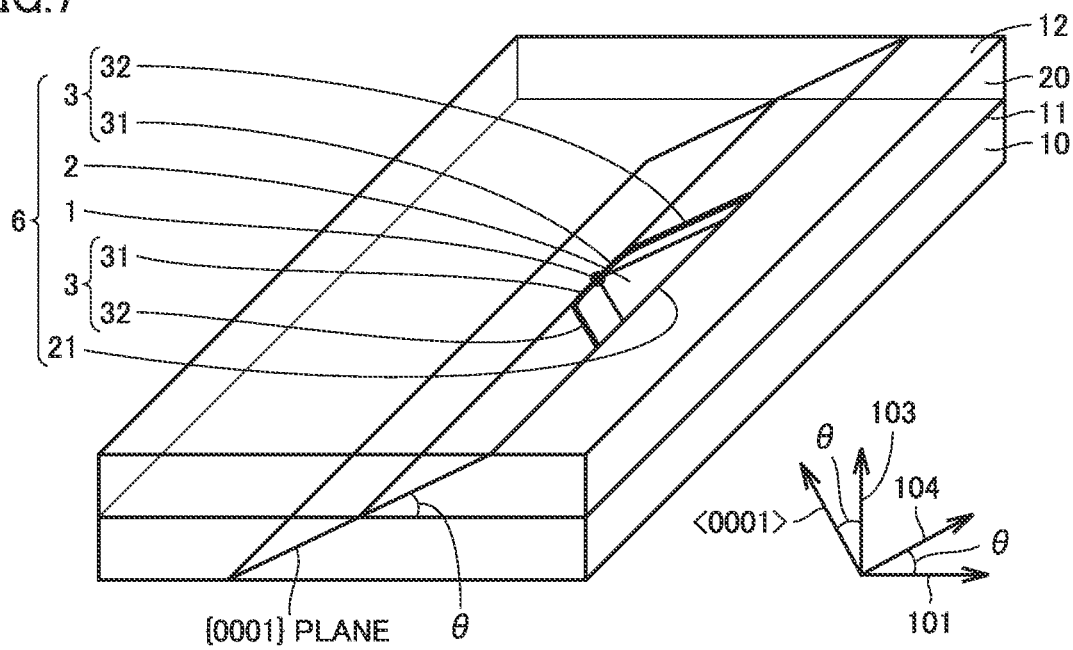
FIG. 7 is a schematic perspective view showing a structure of a second extended defect.

FIG. 6 is an enlarged schematic plan view of a region VI of FIG. 1. FIG. 7 is a schematic perspective view showing a structure of a second extended defect 6. As shown in FIGS. 6 and 7, silicon carbide epitaxial substrate 100 may have second extended defect 6. Second extended defect 6 is in silicon carbide substrate 10. Second extended defect 6 is in silicon carbide epitaxial film 20. Second extended defect 6 is surrounded by silicon carbide epitaxial film 20 when viewed in thickness direction 103 of silicon carbide substrate 10.

Second extended defect 6 includes particle 1, triangular defect 2, and basal plane dislocation 3. Particle 1 is connected to each of basal plane dislocation 3 and triangular defect 2. In other words, each of basal plane dislocation 3 and triangular defect 2 originates from particle 1. As shown in FIG. 6, when viewed in thickness direction 103 of silicon carbide epitaxial film 20, triangular defect 2 has a triangular shape. One of the three vertices of the triangle is connected to particle 1.

As shown in FIG. 7, particle 1 is located, for example, at the boundary between silicon carbide substrate 10 and silicon carbide epitaxial film 20. In other words, particle 1 is located between silicon carbide substrate 10 and silicon carbide epitaxial film 20, for example. Particle 1 is in contact with, for example, fourth main surface 14. Triangular defect 2 extends from particle 1 along off-direction 104. One end of triangular defect 2 in off-direction 104 is connected to particle 1 at the boundary between silicon carbide substrate 10 and silicon carbide epitaxial film 20. The other end of triangular defect 2 in off-direction 104 is exposed on second main surface 12. The portion of triangular defect 2 exposed on second main surface 12 is base 21 of triangular defect 2.

As shown in FIGS. 6 and 7, in second extended defect 6, in the direction (second direction 102) perpendicular to each of thickness direction 103 and off-direction 104 of silicon carbide substrate 10, extended width B of basal plane dislocation 3 is less than twice base width L of triangular defect 2. Second extended defect 6 is different from first extended defect 5 in a ratio of base width L of triangular defect 2 to extended width B of basal plane dislocation 3. Since the other structure of second extended defect 6 is the same as structure of first extended detect 5, redundant description will be omitted.

The area density of basal plane dislocation 3 included in second extended defect 6 is, for example, $1/cm^2$ or more. The area density of basal plane dislocations 3 included in second extended defect 6 may be, for example, $2/cm^2$ or more, $3/cm^2$ or more, or $4/cm^2$ or more. The upper limit of the area density of basal plane dislocations 3 included in second extended defect 6 is not particularly limited, and may be, for example, $10/cm^2$ or less or $8/cm^2$ or less. The area density of basal plane dislocations 3 included in second extended defect 6 is a value obtained by dividing the total number of basal plane dislocations 3 included in second extended defect 6 on second main surface 12 by the area of second main surface 12.

Next, how to count the number of basal plane dislocations 3 will be described. As shown in FIGS. 6 and 7, both ends of basal plane dislocation 3 are exposed to second main surface 12. In this way, basal plane dislocation 3 extending from one end to the other end is counted as one basal plane dislocation 3. In other words, second extended defect 6 shown in FIGS. 6 and 7 includes one basal plane dislocation 3. Four basal plane dislocations 3 are included in first extended defect 5 shown in FIGS. 3 and 4.

Figure 8:
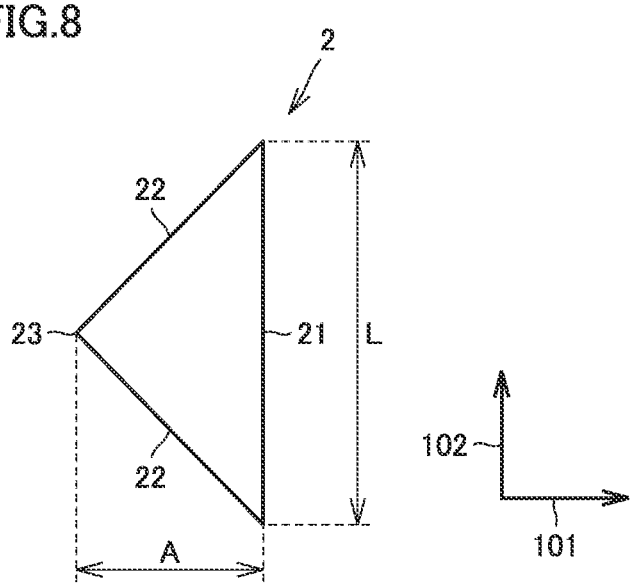
FIG. 8 is a schematic plan view showing a structure of a first example of a triangular defect.

FIG. 8 is a schematic plan view showing a structure of a first example of triangular defect 2. As shown in FIG. 8, when viewed in thickness direction 103 of silicon carbide substrate 10, the shape of triangular defect 2 may be an isosceles triangle. Triangular detect 2 has a pair of legs 22 and base 21. Base 21 is parallel to second direction 102. Each of the pair of legs 22 is connected to a vertex 23 connected to particle 1. The length of one of the pair of legs 22 may be the same as the length of the other of the pair of legs 22. A distance between the pair of legs 22 may increase from the vertex toward base 21. When viewed in thickness direction 103 of silicon carbide substrate 10, each of the pair of legs 22 may be inclined with respect to first direction 101 and inclined with respect to second direction 102.

Figure 9:
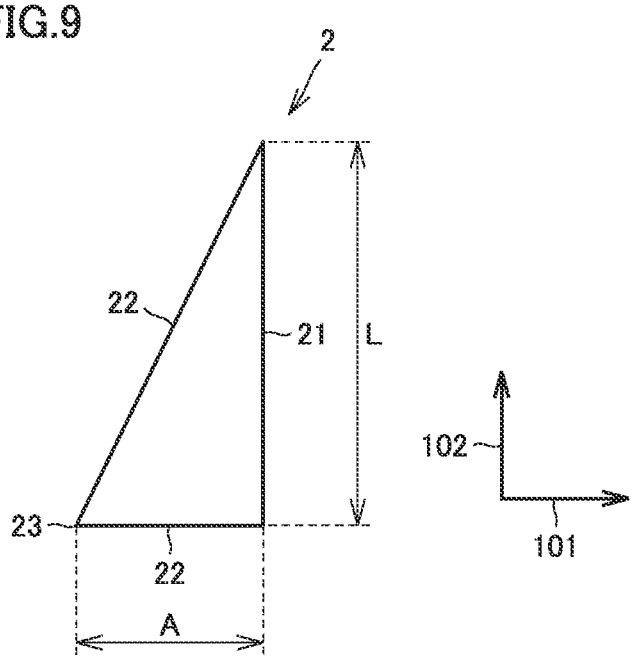
FIG. 9 is a schematic plan view showing a structure of a second example of the triangular defect.

FIG. 9 is a schematic plan view showing a structure of a second example of triangular defect 2. As shown in FIG. 8, when viewed in thickness direction 103 of silicon carbide substrate 10, the shape of triangular defect 2 may be a right triangle. Triangular defect 2 has a pair of legs 22 and base 21. Base 21 is parallel to second direction 102. Each of the pair of legs 22 is connected to vertex 23 connected to particle 1. The length of one of the pair of legs 22 may be different from the length of the other of the pair of legs 22. The distance between the pair of legs 22 may increase from vertex 23 toward base 21. When viewed in thickness direction 103 of silicon carbide substrate 10, one of the pair of legs 22 may be parallel to first direction 101. When viewed in thickness direction 103 of silicon carbide substrate 10, the other of the pair of legs 22 may be inclined with respect to first direction 101 and inclined with respect to second direction 102.

Method for Measuring Extended Defect

Next, a method of measuring an extended defect will be described. For observation of the extended defect, for example, a photoluminescence imaging apparatus (model number: PLI-200-SMH5) manufactured by Photon Design Co., Ltd. is used. When a target region of silicon carbide epitaxial substrate 100 for the measurement is irradiated with excitation light, photoluminescence light is observed from the target region. As the excitation light source, for example, a mercury xenon lamp is used. The excitation light from the light source passes through a 313-nm band-pass filter and the target region is then irradiated therewith. The photoluminescence light, which has a wavelength of 750 nm or more, reaches a photodetector of a camera or the like. In this way, a photoluminescence image of the target region is captured.

For example, while silicon carbide epitaxial substrate 100 is moved in a direction parallel to second main surface 12 of silicon carbide epitaxial film 20, a photoluminescence image of second main surface 12 is captured. The area of one visual field is, for example, 2.6 mm×2.6 mm. Thus, the photoluminescence image in the entire region of second main surface 12 is mapped. An extended defect is identified in the acquired photoluminescence image. In the specified extended defect, each of extended width B of basal plane dislocation 3 and base width L of triangular defect 2 is obtained. An extended defect in which extended width B of basal plane dislocation 3 is twice or more base width L of triangular defect 2 is classified as first extended defect 5. An extended defect in which extended width B of basal plane dislocation 3 is less than twice base width L of triangular defect 2 is classified as second extended defect 6.

Manufacturing Apparatus for Silicon Carbide Epitaxial Substrate

Next, a structure of a manufacturing apparatus 200 for silicon carbide epitaxial substrate 100 will be described.

Figure 10:
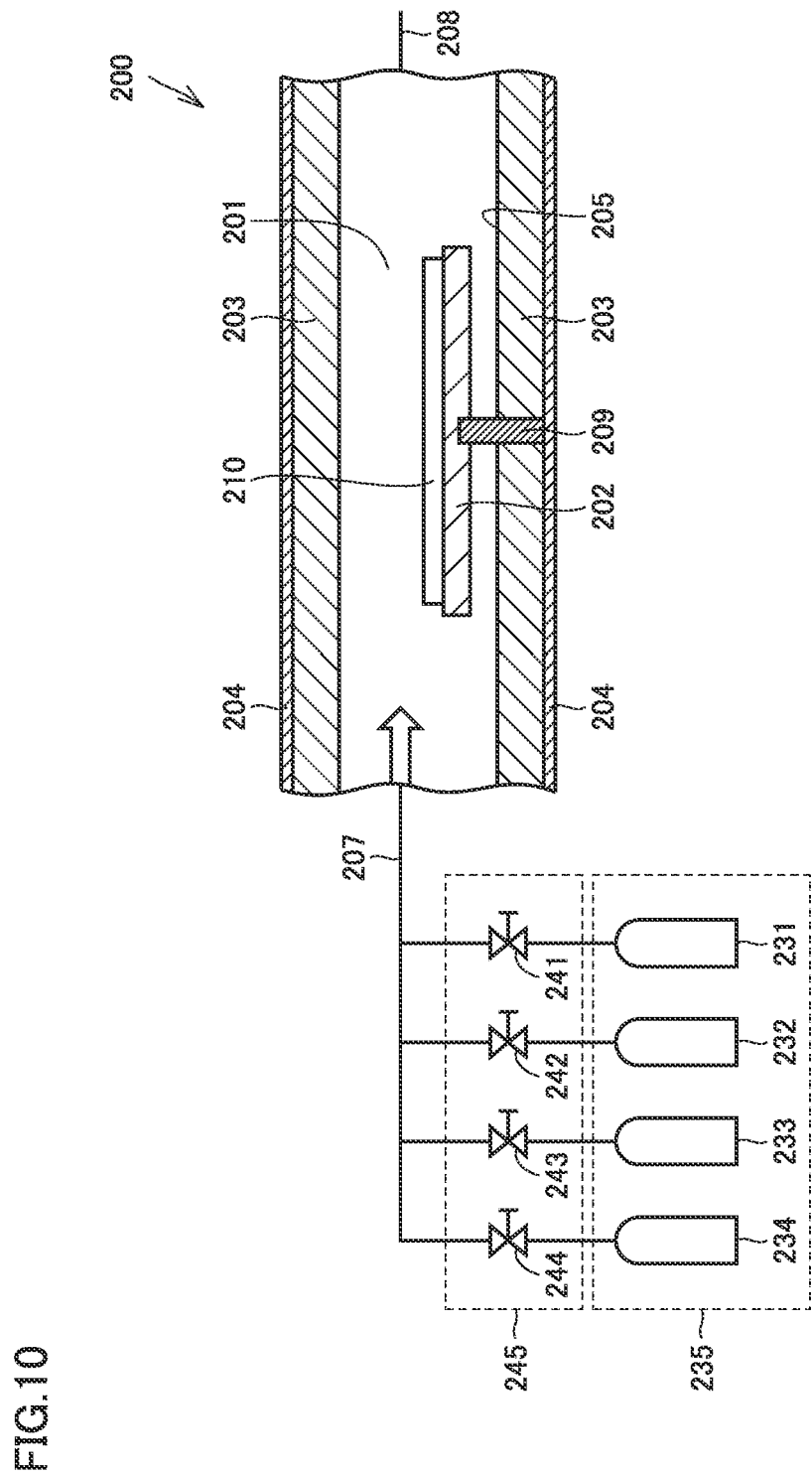
FIG. 10 is a partial cross-sectional schematic view showing a structure of a manufacturing apparatus for a silicon carbide epitaxial substrate.

FIG. 10 is a partial cross-sectional schematic view showing a structure of the manufacturing apparatus for silicon carbide epitaxial substrate 100. As shown in FIG. 10, manufacturing apparatus 200 for silicon carbide epitaxial substrate 100 is, for example, a lateral type CVD (Chemical Vapor Deposition) apparatus of a hot wall system. Manufacturing apparatus 200 mainly includes a reaction chamber 201, a gas supply unit 235, a control unit 245, a stage 202, a heating element 203, a quartz tube 204, a rotating shaft 209, and an induction heating coil (not shown).

Heating element 203 has a cylindrical shape in which reaction chamber 201 is formed, for example. Heating element 203 is made of graphite, for example. An induction heating coil is wound along an outer peripheral surface of quartz tube 204, for example. The induction heating coil is configured to be supplied with an alternating current from an external power supply (not shown). Thereby, heating element 203 is inductively heated. As a result, reaction chamber 201 is heated by heating element 203.

Reaction chamber 201 is a space surrounded by an inner wall surface 205 of heating element 203. Silicon carbide substrate 10 is disposed in reaction chamber 201. Reaction chamber 201 is configured to heat silicon carbide substrate 10. A susceptor 210 for holding silicon carbide substrate 10 is installed in reaction chamber 201. Susceptor 210 is disposed on stage 202. Stage 202 is configured to be rotatable by rotating shaft 209. As stage 202 rotates, susceptor 210 rotates.

Manufacturing apparatus 200 further includes a gas inlet 207 and a gas outlet 208. Gas outlet 208 is connected to an exhaust pump (not shown). The arrows in FIG. 10 indicate the gas flow. Gas is introduced into reaction chamber 201 through gas inlet 207 and exhausted through gas outlet 208. A pressure in reaction chamber 201 is adjusted by a balance between an amount of gas supplied and an amount of gas exhausted.

Gas supply unit 235 is configured to be capable of supplying a mixed gas containing, for example, silane, propane, ammonia, and hydrogen to reaction chamber 201. Specifically, gas supply unit 235 may include a first gas supply unit 231, a second gas supply unit 232, a third gas supply unit 233, and a carrier gas supply unit 234.

First gas supply unit 231 is configured to be capable of supplying a first gas. First gas supply unit 231 is, for example, a gas cylinder filled with the first gas. The first gas may be propane ($C_3H_8$) gas, for example. The first gas may be, for example, methane ($CH_4$) gas, ethane ($C_2H_6$) gas, acetylene ($C_2H_2$) gas, or the like.

Second gas supply unit 232 is configured to be capable of supplying a second gas. Second gas supply unit 232 is, for example, a gas cylinder filled with the second gas. The second gas is, for example, a silane ($SiH_4$) gas. The second gas may be a mixed gas of a silane gas and a gas other than silane.

Third gas supply unit 233 is configured to be capable of supplying a third gas. Third gas supply unit 233 is, for example, a gas cylinder filled with the third gas. The third gas is a doping gas containing N (nitrogen atoms) and is, for example, a nitrogen gas or an ammonia gas.

Carrier gas supply unit 234 is configured to be capable of supplying carrier gas such as hydrogen. Carrier gas supply unit 234 is, for example, a gas cylinder filled with hydrogen.

Control unit 245 is configured to be able to control the flow rate of the mixed gas supplied from gas supply unit 235 to reaction chamber 201. Specifically, control unit 245 may include a first gas flow rate control unit 241, a second gas flow rate control unit 242, a third gas flow rate control unit 243, and a carrier gas flow rate control unit 244. Each control unit may be, for example, an MFC (mass flow controller). Control unit 245 is disposed between gas supply unit 235 and gas inlet 207. In other words, control unit 245 is disposed in a flow path connecting gas supply unit 235 and gas inlet 207.

Method of Manufacturing Silicon Carbide Epitaxial Substrate

Next, a method of manufacturing silicon carbide epitaxial substrate 100 according to an embodiment of the present disclosure will be described.

First, silicon carbide substrate 10 is prepared. For example, a polytype 4H silicon carbide single crystal is produced by a sublimation method. Next, silicon carbide substrate 10 is prepared by slicing the silicon carbide single crystal with, for example, a wire saw. Silicon carbide substrate 10 contains an n-type impurity such as nitrogen. The conductivity type of silicon carbide substrate 10 is, for example, n-type.

Next, silicon carbide substrate 10 is disposed in reaction chamber 201 of the manufacturing apparatus. Silicon carbide substrate 10 is placed on susceptor 210 (see FIG. 10). Silicon carbide substrate 10 has fourth main surface 14. Fourth main surface 14 is inclined in off-direction 104 at an angle of 5° or less with respect to the {0001} plane, for example. Off-direction 104 is, for example, the <11-20> direction. Fourth main surface 14 has a diameter of 100 mm, for example. The polytype of silicon carbide substrate 10 is, for example, 4H.

Next, heating of silicon carbide substrate 10 is started. Hydrogen ($H_2$) gas is introduced into reaction chamber 201 from carrier gas supply unit 234 during the temperature rise. The flow rate of the hydrogen gas is adjusted by carrier gas flow rate control unit 244.

After the temperature of reaction chamber 201 reaches, for example, about 1500° C. to 1700° C., the source gas, the dopant gas, and the carrier gas are supplied to reaction chamber 201. Specifically, by supplying a mixed gas containing silane, ammonia, hydrogen, and propane to reaction chamber 201, each gas is thermally decomposed. The flow rate of the silane gas is, for example, 46 sccm. The flow rate of the propane gas is, for example, 29 sccm. The flow rate of ammonia gas is, for example, 1.5 sccm. The flow rate of the carrier gas is, for example, 100 slm. A pressure in reaction chamber 201 is determined by a balance between the flow rate of the gas supplied to reaction chamber 201 and the flow rate of the gas discharged from reaction chamber 201.

Accordingly, silicon carbide epitaxial film 20 is formed on silicon carbide substrate 10 in reaction chamber 201. Silicon carbide epitaxial film 20 has a thickness of 30 µm to 50 µm, for example. The n-type impurity concentration of silicon carbide epitaxial film 20 is, for example, $1\times10^{15}$ cm$^{-3}$ to $1\times10^{19}$ cm$^{-3}$.

Figure 11:
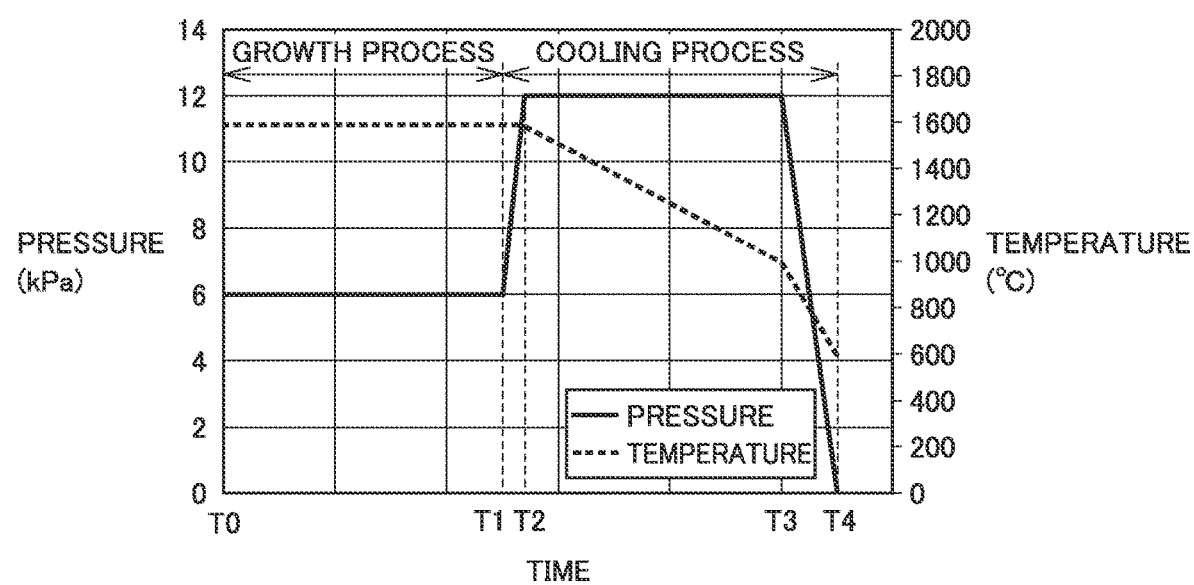
FIG. 11 is a schematic view showing a relationship between time and each of a temperature in a reaction chamber and a pressure in the reaction chamber.

FIG. 11 is a schematic view showing a relationship between time and each of the temperature in reaction chamber 201 and the pressure in reaction chamber 201. As shown in FIG. 11, a growth process of silicon carbide epitaxial film 20 is from a time T0 to a time T1. In the growth process of silicon carbide epitaxial film 20, the temperature of reaction chamber 201 is, for example, 1600° C., and the pressure of reaction chamber 201 is, for example, 6 kPa. As shown in FIG. 11, a cooling process of silicon carbide epitaxial film 20 is from time T1 to a time T4. From time T1 to a time T2, the pressure in reaction chamber 201 rises from 6 kPa to 12 kPa. The temperature of reaction chamber 201 may be maintained at 1600° C. while the pressure in reaction chamber 201 is rising.

In the cooling process of silicon carbide epitaxial substrate 100, the temperature of reaction chamber 201 is lowered to 1000° C. in a state where the temperature of reaction chamber 201 is maintained at, for example, 10 kPa or higher. To be more specific, the temperature in reaction chamber 201 is lowered from 1600° C. to about 1000° C. while the pressure in reaction chamber 201 is maintained at, for example, about 12 kPa. During the cooling process from time T2 to a time T3, a cooling rate of silicon carbide epitaxial substrate 100 in reaction chamber 201 is, for example, 15° C./min or less. From time T2 to time T3 of the cooling process, the cooling rate of silicon carbide epitaxial substrate 100 in reaction chamber 201 may be, for example, 10° C./min or less, or 5° C./min or less. The lower limit of the cooling rate of silicon carbide epitaxial substrate 100 in reaction chamber 201 is not particularly limited, and may be, for example, 1° C./min or more. In the cooling process, a carrier gas may or may not be introduced into reaction chamber 201.

After the temperature of silicon carbide epitaxial substrate 100 reaches 1000° C., silicon carbide epitaxial substrate 100 may be naturally cooled. As shown in FIG. 11, the cooling rate of silicon carbide epitaxial substrate 100 after the temperature of silicon carbide epitaxial substrate 100 becomes 1000° C. or less may be faster than the cooling rate of silicon carbide epitaxial substrate 100 until the temperature of silicon carbide epitaxial substrate 100 becomes 1000° C. Specifically, the cooling rate of silicon carbide epitaxial substrate 100 from time T3 to time T4 may be faster than the cooling rate of silicon carbide epitaxial substrate 100 from time T2 to time T3. From time T3 to time T4, the pressure in reaction chamber 201 decreases from 12 kPa to about 0 kPa. Thus, silicon carbide epitaxial substrate 100 is manufactured (see FIG. 1).

Advantageous effects of silicon carbide epitaxial substrate 100 and the method of manufacturing the same according to the embodiment of the present disclosure will be described.

When particle 1 is present at the boundary between silicon carbide substrate 10 and silicon carbide epitaxial film 20 for some reason, basal plane dislocation 3 connected to particle 1 may be generated. Basal plane dislocation 3 extends in the direction (second direction 102) perpendicular to the step-flow growth direction of silicon carbide epitaxial film 20 (off-direction 104 of silicon carbide substrate 10). In particular, in a state where an in-plane temperature distribution of silicon carbide epitaxial substrate 100 is large, basal plane dislocation 3 greatly extends in order to relax the stress generated in silicon carbide epitaxial substrate 100.

As a result of intensive studies on a method of suppressing extended width B of basal plane dislocation 3, the inventor has obtained the following findings and found an embodiment of the present disclosure. Specifically, the inventors have noted that extended width B of basal plane dislocation 3 increases when the temperature distribution of silicon carbide epitaxial substrate 100 is large during the period from when silicon carbide epitaxial film 20 is formed on silicon carbide substrate 10 to when silicon carbide epitaxial substrate 100 is cooled to about 1000° C. As a result, it was found that extended width B of basal plane dislocation 3 can be significantly reduced by controlling the cooling rate of silicon carbide epitaxial substrate 100 to be low in the temperature range from the growth temperature of silicon carbide epitaxial film 20 to 1000° C.

In detail, in silicon carbide epitaxial substrate 100 according to the embodiment of the present disclosure, the area density of basal plane dislocations 3 included in first extended defect 5 in which extended width B of basal plane dislocation 3 is twice or more base width L of triangular defect 2 in direction 102 perpendicular to each of thickness direction 103 and off-direction 104 of silicon carbide substrate 10 is 3/cm$^2$ or less. Accordingly, it is possible to suppress a decrease in reliability of a silicon carbide semiconductor device manufactured using silicon carbide epitaxial substrate 100.

On the other hand, when extended width B of basal plane dislocation 3 is decreased, the area density of second extended defect 6 in which extended width B of basal plane dislocation 3 is less than twice base width L of triangular defect 2 is increased. However, second extended defect 6 does not significantly affect the reliability of the silicon carbide semiconductor device. Therefore, it is possible to suppress a decrease in reliability of a silicon carbide semiconductor device manufactured using silicon carbide epitaxial substrate 100.

Also, stress generated in silicon carbide epitaxial film 20 increases as the thickness of silicon carbide epitaxial film 20 increases. Therefore, as the thickness of silicon carbide epitaxial film 20 increases, extended width B of basal plane dislocation 3 increases. In silicon carbide epitaxial substrate 100 according to the embodiment of the present disclosure, silicon carbide epitaxial film 20 may have a thickness of 30 µm or more. Thus, when the thickness of silicon carbide epitaxial film 20 is large, extended width B of basal plane dislocation 3 can be reduced particularly effectively.

EXAMPLES

Sample Preparation

Silicon carbide epitaxial film 20 was formed on silicon carbide substrate 10 using the method of manufacturing silicon carbide epitaxial substrate 100 described above. Next, silicon carbide epitaxial substrate 100 was cooled. While changing the cooling rate of silicon carbide epitaxial substrate 100 between the growth temperature of silicon carbide epitaxial film 20 and 1000° C., the average value of extended width B of first extended defect 5 and second extended defect 6, the area density of basal plane dislocation 3 included in first extended defect 5, and the area density of basal plane dislocation 3 included in second extended defect 6 were obtained. The cooling rate of silicon carbide epitaxial substrate 100 from the growth temperature of silicon carbide epitaxial film 20 to 1000° C. was 30° C. min, 20° C./min, 15° C./min, 10° C./min, 5° C./min and 1° C./min. The test was performed in a case where the carrier gas was introduced into reaction chamber 201 (with the carrier gas) and in a case where the carrier gas was not introduced into reaction chamber 201 (without the carrier gas).

Experimental Method

Next, first extended defect 5 and second extended defect 6 were identified using a photoluminescence imaging apparatus (model number: PLI-200-SMH5) manufactured by Photon Design Co., Ltd. While moving silicon carbide epitaxial substrate 100 in the direction parallel to second main surface 12 of silicon carbide epitaxial film 20, a photoluminescence image of second main surface 12 was captured. The area of one visual field of the photoluminescence image was 2.6 mm×2.6 mm. Extended defects were identified in the acquired photoluminescence images. For all the specified extended defects, each of extended width B of basal plane dislocation 3 and base width L of triangular defect 2 was obtained. An extended defect in which extended width B of basal plane dislocation 3 twice or more base width L of triangular defect 2 was classified as first extended defect 5. An extended defect in which extended width B of basal plane dislocation 3 was less than twice base width L of triangular defect 2 was classified as second extended defect 6. The average value of extended widths B of all the extended defects was obtained.

In each of first extended defect 5 and second extended defect 6, basal plane dislocations 3 were dense. In order to simply estimate the number of basal plane dislocations 3, it was estimated that when one first extended defect 5 present in one field of view of the photoluminescence image, 15 basal plane dislocations 3 were included in one first extended defect 5. Similarly, it was estimated that when one second extended defect 6 was present in one field of view of the photoluminescence image, 15 basal plane dislocations 3 were included in one second extended defect 6.

Experimental Results

TABLE 1

Thickness of Silicon Carbide Epitaxial Film: 30 μm

| | Cooling Rate (° C./Min) | 30 | 20 | 15 | 10 | 5 | 1 |
|---|---|---|---|---|---|---|---|
| With Carrier Gas | Average Value of Extended Widths (mm) | 30.7 | 14.0 | 9.6 | 6.7 | 4.4 | 3.2 |
| | Area Density of Basal Plane Dislocation Included in First Extended Defect (/cm²) | 3.7 | 1.7 | 1.2 | 0.8 | 0.6 | 0.5 |
| | Area Density of Basal Plane Dislocation Included in Second Extended Defect (/cm²) | 1.7 | 3.0 | 4.1 | 4.5 | 4.5 | 4.8 |
| Without Carrier Gas | Average Value of Extended Widths (mm) | 12.3 | 5.6 | 3.8 | 2.7 | 1.8 | 1.3 |
| | Area Density of Basal Plane Dislocation Included in First Extended Defect (/cm²) | 1.1 | 0.5 | 0.4 | 0.2 | 0.2 | 0.1 |
| | Area Density of Basal Plane Dislocation Included in Second Extended Defect (/cm²) | 4.1 | 4.5 | 5.0 | 4.8 | 4.5 | 4.0 |

Table 1 shows the results when silicon carbide epitaxial film 20 has a thickness of 30 μm. As shown in Table 1, when the carrier gas was introduced into reaction chamber 201, the area density of basal plane dislocation 3 included in first extended defect 5 was 3/cm² or less by setting the cooling rate of silicon carbide epitaxial substrate 100 to 20° C./min or less. In this case, the area density of basal plane dislocation 3 included in second extended defect 6 was 3/cm² or more. When the carrier gas was introduced into reaction chamber 201, the average value of extended widths B of the extended defects became 10 mm or less by setting the cooling rate of silicon carbide epitaxial substrate 100 to 15° C./min or less.

When no carrier gas was introduced into reaction chamber 201, the area density of basal plane dislocations 3 included in first extended defect 5 was 3/cm² or less by setting the cooling rate of silicon carbide epitaxial substrate 100 to 30° C./min or less. In this case, the area density of basal plane dislocation 3 included in second extended defect 6 was 4/cm² or more. When no carrier gas was introduced into reaction chamber 201, the mean value of extended width B of the extended defect became 10 mm or less by setting the cooling rate of silicon carbide epitaxial substrate 100 to 20° C./min or less.

TABLE 2

Thickness of Silicon Carbide Epitaxial Film: 40 μm

| | Cooling Rate (° C./Min) | 30 | 20 | 15 | 10 | 5 | 1 |
|---|---|---|---|---|---|---|---|
| With Carrier Gas | Average Value of Extended Widths (mm) | 40.9 | 18.6 | 12.7 | 8.9 | 5.9 | 4.3 |
| | Area Density of Basal Plane Dislocation Included in First Extended Defect (/cm²) | 4.9 | 2.2 | 1.5 | 1.1 | 0.7 | 0.5 |
| | Area Density of Basal Plane Dislocation Included in Second Extended Defect (/cm²) | 1.1 | 3.8 | 4.5 | 5.0 | 5.3 | 5.5 |
| Without Carrier Gas | Average Value of Extended Widths (mm) | 16.4 | 7.4 | 5.1 | 3.6 | 2.4 | 1.7 |

TABLE 2-continued

Thickness of Silicon Carbide Epitaxial Film: 40 μm

| Cooling Rate (° C./Min) | 30 | 20 | 15 | 10 | 5 | 1 |
|---|---|---|---|---|---|---|
| Area Density of Basal Plane Dislocation Included in First Extended Defect (/cm$^2$) | 1.9 | 0.9 | 0.7 | 0.3 | 0.3 | 0.2 |
| Area Density of Basal Plane Dislocation Included in Second Extended Defect (/cm$^2$) | 4.0 | 5.0 | 5.4 | 5.5 | 5.7 | 5.8 |

Table 2 shows the results when silicon carbide epitaxial film 20 has a thickness of 40 μm. As shown in Table 2, when the carrier gas was introduced into reaction chamber 201, the area density of basal plane dislocation 3 included in first extended defect 5 was 3/cm$^2$ or less by setting the cooling rate of silicon carbide epitaxial substrate 100 to or less. In this case, the area density of basal plane dislocation 3 included in second extended defect 6 was 3.8 /cm$^2$ or more. When the carrier gas was introduced into reaction chamber 201, the average value of extended widths B of the extended defects became 10 mm or less by setting the cooling rate of silicon carbide epitaxial substrate 100 to 10° C./min or less.

When no carrier gas was introduced into reaction chamber 201, the area density of basal plane dislocation 3 included in first extended defect 5 was 3/cm$^2$ or less by setting the cooling rate of silicon carbide epitaxial substrate 100 to 30° C./min or less. In this case, the area density of basal plane dislocation 3 included in second extended defect 6 was 4/cm$^2$ or more. When no carrier gas was introduced into reaction chamber 201, the average value of extended widths 13 of the extended defects became 10 mm or less by setting the cooling rate of silicon carbide epitaxial substrate 100 to 20° C./min or less.

TABLE 3

Thickness of Silicon Carbide Epitaxial Film: 50 μm

| | Cooling Rate (° C./Min) | 30 | 20 | 15 | 10 | 5 | 1 |
|---|---|---|---|---|---|---|---|
| With Carrier Gas | Average Value of Extended Widths (mm) | 51.2 | 23.3 | 15.9 | 11.2 | 7.3 | 5.4 |
| | Area Density of Basal Plane Dislocation Included in First Extended Defect (/cm$^2$) | 6.2 | 2.8 | 1.9 | 1.3 | 0.9 | 0.9 |
| | Area Density of Basal Plane Dislocation Included in Second Extended Defect (/cm$^2$) | 1.9 | 5.2 | 6.1 | 6.6 | 7.1 | 7.5 |
| Without Carrier Gas | Average Value of Extended Widths (mm) | 20.5 | 9.3 | 6.4 | 4.5 | 2.9 | 2.2 |
| | Area Density of Basal Plane Dislocation Included in First Extended Defect (/cm$^2$) | 2.5 | 1.2 | 0.8 | 0.5 | 0.3 | 0.2 |
| | Area Density of Basal Plane Dislocation Included in Second Extended Defect (/cm$^2$) | 5.5 | 6.9 | 7.4 | 7.0 | 7.7 | 7.7 |

Table 3 shows the results when silicon carbide epitaxial film 20 has a thickness of 50 μm. As shown in Table 3, when the carrier gas was introduced into reaction chamber 201, the area density of basal plane dislocation 3 included in first extended defect 5 was 3/cm$^2$ or less by setting the cooling rate of silicon carbide epitaxial substrate 100 to 20° C./min or less. In this case, the area density of basal plane dislocation 3 included in second extended defect 6 was 5.2/cm$^2$ or more. When the carrier gas was introduced into reaction chamber 201, the average value of extended widths B of the extended defects became 10 mm or less by setting the cooling rate of silicon carbide epitaxial substrate 100 to 5° C./min or less.

When no carrier gas was introduced into reaction chamber 201, the area density of basal plane dislocation 3 included in first extended defect 5 was 3/cm$^2$ or less by setting the cooling rate of silicon carbide epitaxial substrate 100 to 30° C./min or less. In this case, the area density of basal plane dislocation 3 included in second extended defect 6 was 5.5/cm$^2$ or more. When no carrier gas was introduced into reaction chamber 201, the average value of extended widths B of the extended defects became 10 mm or less by setting the cooling rate of silicon carbide epitaxial substrate 100 to 20° C./min or less.

It is to be understood that the embodiments and examples disclosed herein are illustrative in all respects and are not restrictive. The scope of the present invention is defined not by the above-described embodiments and examples but by the claims, and is intended to include meanings equivalent to the claims and all modifications within the scope.

REFERENCE SIGNS LIST

1 particle, 2 triangular defect, 3 basal plane dislocation, 5 first extended defect, 6 second extended defect, 10 silicon carbide substrate, 11 first main surface, 12 second main surface, 13 third main surface, 14 fourth main surface, 17 orientation flat, 18 arc-shaped portion, 19 outer peripheral edge, 20 silicon carbide epitaxial film, 21 base, 22 leg, 23 vertex, 31 first portion, 32 second portion, 100 silicon carbide epitaxial substrate, 101 first direction, 102 second direction (direction perpendicular to both thickness direction and off-direction), 103 third direction (thickness direction), 104 fourth direction (off-direction), 200 manufacturing apparatus, 201 reaction chamber, 202 stage, 203 heating element, 204 quartz tube, 205 inner wall surface, 207 gas inlet, 208 gas outlet, 209 rotating shaft, 210 susceptor, 231 first gas supply unit, 232 second gas supply unit, 233 third gas supply unit, 234 carrier gas supply unit, 235 gas supply unit, 241 first gas flow rate control unit, 242 second gas flow rate control unit, 243 third gas flow rate control unit, 244 carrier gas flow rate control unit, 245 control unit, A length, B extended width, D thickness, L base width, T0, T1, T2, T3, T4 time, W diameter, θ off-angle.

The invention claimed is:

1. A silicon carbide epitaxial substrate comprising:
a silicon carbide substrate;

a silicon carbide epitaxial film on the silicon carbide substrate; and a first extended defect in the silicon carbide epitaxial film, wherein the silicon carbide epitaxial film has a first main surface in contact with the silicon carbide substrate and a second main surface opposite to the first main surface, the second main surface is inclined in an off-direction with respect to a {0001} plane, wherein the first extended defect includes a particle, a triangular defect extending from the particle along the off-direction, and a basal plane dislocation originating from the particle and having a portion extending along a direction perpendicular to each of a thickness direction of the silicon carbide substrate and the off-direction, in the direction perpendicular to each of the thickness direction of the silicon carbide substrate and the off-direction, an extended width of the basal plane dislocation is twice or more a base width of the triangular defect, and in the second main surface, an area density of the basal plane dislocation included in the first extended defect is $3/cm^2$ or less.

2. The silicon carbide epitaxial substrate according to claim 1, wherein the silicon carbide epitaxial film has a thickness of 30 μm or more.

3. The silicon carbide epitaxial substrate according to claim 1, wherein the second main surface is inclined in the off-direction at an angle of 5° or less with respect to the {0001} plane.

4. The silicon carbide epitaxial substrate according to claim 1, wherein the silicon carbide substrate has a diameter of 100 mm or more.

5. The silicon carbide epitaxial substrate according to claim 1, wherein a polytype of the silicon carbide substrate is 4H.

6. A silicon carbide epitaxial substrate comprising:

a silicon carbide substrate;

a silicon carbide epitaxial film on the silicon carbide substrate; and a first extended defect in the silicon carbide epitaxial film, wherein the silicon carbide epitaxial film has a first main surface in contact with the silicon carbide substrate and a second main surface opposite to the first main surface, the second main surface is inclined in an off-direction with respect to a {0001} plane, wherein the first extended defect includes a particle, a triangular defect extending from the particle along the off-direction, and a basal plane dislocation originating from the particle and having a portion extending along a direction perpendicular to each of a thickness direction of the silicon carbide substrate and the off-direction, in the direction perpendicular to each of the thickness direction of the silicon carbide substrate and the off-direction, an extended width of the basal plane dislocation is twice or more a base width of the triangular defect, in the second main surface, an area density of the basal plane dislocation included in the first extended defect is $3/cm^2$ or less, the silicon carbide epitaxial film has a thickness of 30 μm or more, the second main surface is inclined in the off-direction at an angle of 5° or less with respect to the {0001} plane, the silicon carbide substrate has a diameter of 100 mm or more, and a polytype of the silicon carbide substrate is 4H.

* * * * *